(12) United States Patent
Oh et al.

(10) Patent No.: US 7,985,999 B2
(45) Date of Patent: Jul. 26, 2011

(54) SEMICONDUCTOR DEVICE HAVING CAPACITOR

(75) Inventors: Jung-Min Oh, Incheon-Gwangyeoksi (KR); Jeong-Nam Han, Seoul (KR); Chang-Ki Hong, Seongnam-si (KR); Woo-Gwan Shim, Yongin-si (KR); Im-Soo Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/659,724

(22) Filed: Mar. 18, 2010

(65) Prior Publication Data

US 2010/0187654 A1  Jul. 29, 2010

Related U.S. Application Data

(62) Division of application No. 11/593,067, filed on Nov. 6, 2006, now Pat. No. 7,820,508.

(30) Foreign Application Priority Data

Nov. 14, 2005  (KR) .......................... 10-2005-0108694

(51) Int. Cl.
*H01L 27/108* (2006.01)
(52) U.S. Cl. ................ 257/306; 257/311; 257/E21.046; 257/E21.649; 257/E27.086; 257/E29.112; 438/396
(58) Field of Classification Search .................. 257/306, 257/311, E27.086, E29.112, E21.046, E21.649; 438/253, 396
See application file for complete search history.

(56) References Cited

U.S. PATENT DOCUMENTS

| 6,458,653 | B1 | 10/2002 | Jang |
| 6,667,209 | B2 | 12/2003 | Won et al. |
| 2002/0019107 | A1 | 2/2002 | Lin et al. |
| 2005/0116318 | A1* | 6/2005 | Park .............................. 257/532 |
| 2005/0245026 | A1 | 11/2005 | Kim et al. |
| 2007/0093055 | A1 | 4/2007 | Chou et al. |

FOREIGN PATENT DOCUMENTS

| KR | 10-2002-0057698 | 7/2002 |
| KR | 10-2003-0067821 | 8/2003 |
| KR | 10-2004-0110281 | 12/2004 |

* cited by examiner

*Primary Examiner* — Toniae M Thomas
(74) *Attorney, Agent, or Firm* — Harness, Dickey & Pierce, P.L.C.

(57) ABSTRACT

A semiconductor device having a capacitor and a method of fabricating the same may be provided. A method of fabricating a semiconductor device may include forming an etch stop layer and a mold layer sequentially on a substrate, patterning the mold layer to form a mold electrode hole exposing a portion of the etch stop layer, etching selectively the exposed etch stop layer by an isotropic dry etching process to form a contact electrode hole through the etch stop layer to expose a portion of the substrate, forming a conductive layer on the substrate and removing the conductive layer on the mold layer on the mold layer to form a cylindrical bottom electrode in the mold and contact electrode holes. The isotropic dry etching process may utilize a process gas including main etching gas and selectivity adjusting gas. The selectivity adjusting gas may increase an etch rate of the etch stop layer by more than an etch rate of the mold layer by the isotropic wet etching process.

8 Claims, 10 Drawing Sheets

SEMICONDUCTOR DEVICE HAVING CAPACITOR

PRIORITY STATEMENT

This application is a divisional application of U.S. application Ser. No. 11/593,067, filed Nov. 6, 2006 now U.S. Pat. No. 7,820,508, which claims priority under 35 USC §119 to Korean Patent Application No. 10-2005-0108694, filed on Nov. 14, 2005, in the Korean Intellectual Property Office (K/PO), the entire contents of which are herein incorporated by reference.

BACKGROUND

1. Field

Example embodiments relate to a semiconductor device and a method of fabricating the same. Other example embodiments relate to a semiconductor device having a capacitor and a method of fabricating the same.

2. Description of the Related Art

Generally, a capacitor may be used in a semiconductor device because of its electrical charge storing function. A unit cell of a D-RAM may include a capacitor as an element to store electrical charges. Due to a relatively high-integration trend of a semiconductor device, an area for a capacitor has been gradually reduced. A capacitor having a relatively high electrostatic capacity in a limited area is being developed.

A cylindrical capacitor may be used to increase the electrostatic capacity in a limited area. In the cylindrical capacitor, a top electrode may cover inner and outer sides of a cylindrical bottom electrode. Because an overlapping area of the bottom and top electrodes is increased in a limited area, an electrostatic capacity of the cylindrical capacitor may be improved. A method of forming a cylindrical bottom electrode will be described in detail with reference to FIGS. 1A to 1C.

FIGS. 1A to 1C are diagrams illustrating a method of forming a conventional cylindrical bottom electrode. Referring to FIG. 1A, an interlayer oxide layer 2 may be formed on a semiconductor substrate 1. Contact plugs 3 may be formed to contact the semiconductor substrate 1 through the interlayer oxide layer 2. An etch stop layer 4 and a mold oxide layer 5 may be sequentially formed on an entire surface of the semiconductor substrate 1. The etch stop layer 4 may be formed of a silicon nitride layer having an etch selectivity with respect to the mold oxide layer 5. The mold oxide layer 5 may be patterned to expose the etch stop layer 4 on the contact plug 3. The exposed etch stop layer 4 may be anisotropically etched to form an electrode hole 6 exposing the contact plug 3.

Referring to FIG. 1B, a conductive layer may be formed on an entire surface of the semiconductor substrate 1, and then a sacrificial oxide layer may be formed on the conductive layer. The sacrificial oxide layer and the conductive layer may be planarized to expose the top of the mold oxide layer 5, and then to form a cylindrical bottom electrode 7 and sacrificial oxide pattern 8 in the electrode hole 6. Referring to FIG. 1C, the mold oxide layer 5 and the sacrificial oxide pattern 8 may be removed using a wet etching process to expose the inner and outer sidewalls in the bottom electrode 7.

According to the method of forming the conventional cylindrical bottom electrode, when forming the electrode hole 6, the etch stop layer 4 exposed by patterning the mold oxide layer 5 may be removed using an anisotropic etching process. During this process, various problems may occur. In the anisotropic etching process, ionic components of etching gas may be anisotropically moved by an electrical field to etch target materials. Because this anisotropic etching process also may include etching by a physical reaction, an etch selectivity between materials may be reduced. For example, the etch stop layer 4 formed of a silicon nitride layer may be anisotropically etched generally using a process gas (e.g., fluorocarbon-based gas, argon gas and/or oxygen gas). An etch selectivity of the etch stop layer 4 to the mold oxide layer 5 may be about 4:1.

As illustrated FIGS. 1A to 1C, due to this relatively low etch selectivity, a bowing effect may occur so that the top of the electrode hole 6 may be formed in a jar shape when the exposed etch stop layer 4 is anisotropically etched. An interval between the bottom electrodes 7 formed along the sidewall of the electrode hole 6 may be decreased so that top sidewalls between adjacent bottom electrodes 7 may be contacted. Defects of the semiconductor device may occur. If an interval between the top sidewalls is decreased by the bowing effect, stiction may increase by the surface tension of a water layer when the mold oxide layer 5 and the sacrificial pattern 8 may be removed by a wet etching process. Contact phenomena between adjacent bottom electrodes 7 may occur more frequently.

When semiconductor devices are more highly integrated, an aspect ratio of the electrode hole 6 may be relatively high. By anisotropic-etching of the electrode hole 6 with a relatively high aspect ratio and the exposed etch stop layer 4, a portion of the etch stop layer 4 in the sidewall of the electrode hole 6 may be formed at a slant. The bottom area of the electrode hole 6 may be decreased, and also the bottom area of the bottom electrode may be decreased. Because a support portion of the bottom electrode 7 is decreased, the bottom electrode 7 may be more slanted. Due to the decrease of the support portion, the stiction may become more considerable.

SUMMARY

Example embodiments provide a semiconductor device preventing or reducing a contact phenomenon between bottom electrodes and a method of fabricating the same.

According to example embodiments, a method of fabricating a semiconductor device may include sequentially forming an etch stop layer and a mold layer on a substrate, patterning the mold layer to form a mold electrode hole exposing a portion of the etch stop layer, etching the exposed etch stop layer by an isotropic dry etching process to form a contact electrode hole through the etch stop layer, forming a conductive layer on the substrate and removing the conductive layer on the mold layer to form a cylindrical bottom electrode in the mold electrode hole and the contact electrode hole.

The isotropic dry etching process may be performed with process gas including main etching gas and selectivity adjusting gas. The selectivity adjusting gas may increase an etch rate of the etch stop layer by the isotropic dry etching process more than an etch rate of the mold layer by the isotropic dry etching process. In example embodiments, at least a portion of the contact electrode hole may have a diameter larger than a bottom diameter of the mold electrode hole adjacent to the contact electrode hole.

In further example embodiments, forming the mold layer may include sequentially-stacking a bottom material layer and a top material layer having an etch rate lower than an etch rate of the bottom material layer. Forming the mold electrode hole may include patterning the top and bottom material layers continuously to form a preliminary mold electrode hole and forming a mold electrode hole with a step-like sidewall by selectively isotropic-etching the bottom material layer exposed to the preliminary mold electrode hole. The mold electrode hole may include a first part through the bottom material layer, and a second part through the top material layer. The second part may be disposed on the first part to be connected to the first part. The first part may have a top diameter larger than a bottom diameter of the second part. At least a portion of the contact electrode hole may have a diameter larger than the bottom diameter of the first part in the mold electrode hole.

In other example embodiments, the etch stop layer may be a silicon nitride layer, and the main etching gas may be fluorocarbon-based gas. The selectivity adjusting gas may be at least one selected from the group consisting of HF gas, $H_2O$ gas and/or $C_2H_5OH$ gas. A flow rate of the selectivity adjusting gas may be about 10 sccm to about 500 sccm. The process gas may further include activation auxiliary gas accelerating activation of the main etching gas. The process gas may further include byproduct auxiliary gas accelerating formation of a volatile byproduct during the isotropic dry etching process. In other example embodiments, the etch rate of the etch stop layer may be about ten times of the etch rate of the mold layer by the isotropic dry etching process, or more.

In other example embodiments, the isotropic dry etching process may be performed using radical components of the process gas in a plasma state formed by a remote plasma method. Forming the etch stop layer may further include forming an interlayer insulation layer on the substrate and forming a contact plug through the interlayer insulation layer. The contact electrode hole may expose the contact plug. The method of fabricating a semiconductor device may further include removing the mold layer, forming dielectric layer on a surface of the cylindrical bottom electrode and forming a top electrode on the dielectric layer. Forming the bottom electrode may include forming a sacrificial layer on the conductive layer, planarizing the sacrificial layer and the conductive layer, until a top of the mold layer is exposed, to form the bottom electrode and a sacrificial pattern and removing the sacrificial pattern.

According to example embodiments, a semiconductor device may include an etch stop layer on a substrate and a bottom electrode having a support portion in a contact electrode hole through the etch stop layer and a cylindrical sidewall extending upward from the support portion. At least a portion of the support portion may have a diameter larger than a bottom outer diameter of the cylindrical sidewall adjacent to the support portion.

In some example embodiments, the cylindrical sidewall may be extended upward in a linear form. The cylindrical sidewall may be slanted and may have a top outer diameter larger than the bottom outer diameter of the cylindrical sidewall.

In further example embodiments, the cylindrical sidewall may be in step form, and may include sequentially-stacked first and second sidewalls, and a connection part connecting the first sidewall to the second sidewall. The first sidewall may have a top outer diameter larger than a bottom outer diameter of the second sidewall. The bottom outer diameter of the cylindrical sidewall adjacent to the contact electrode hole may be a bottom outer diameter of the first sidewall. The semiconductor device may further include an interlayer insulation layer on the substrate and a contact plug through the interlayer insulation layer. The etch stop layer may cover the interlayer insulation layer, the contact electrode hole may expose the contact plug and the support portion may be connected to the contact plug. There may be a dielectric layer on a surface of the bottom electrode and a top electrode on the dielectric layer to cover the bottom electrode.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 3 is a diagram illustrating a semiconductor device having a capacitor according to example embodiments;

FIG. 5 is a diagram illustrating a semiconductor device having a capacitor according to other example embodiments; and FIG. 6 is a graph illustrating characteristics of selectivity adjusting gas by an etching process that etches an etch stop layer according to example embodiments.

DETAILED DESCRIPTION OF THE EXAMPLE EMBODIMENTS

Figure 1A:
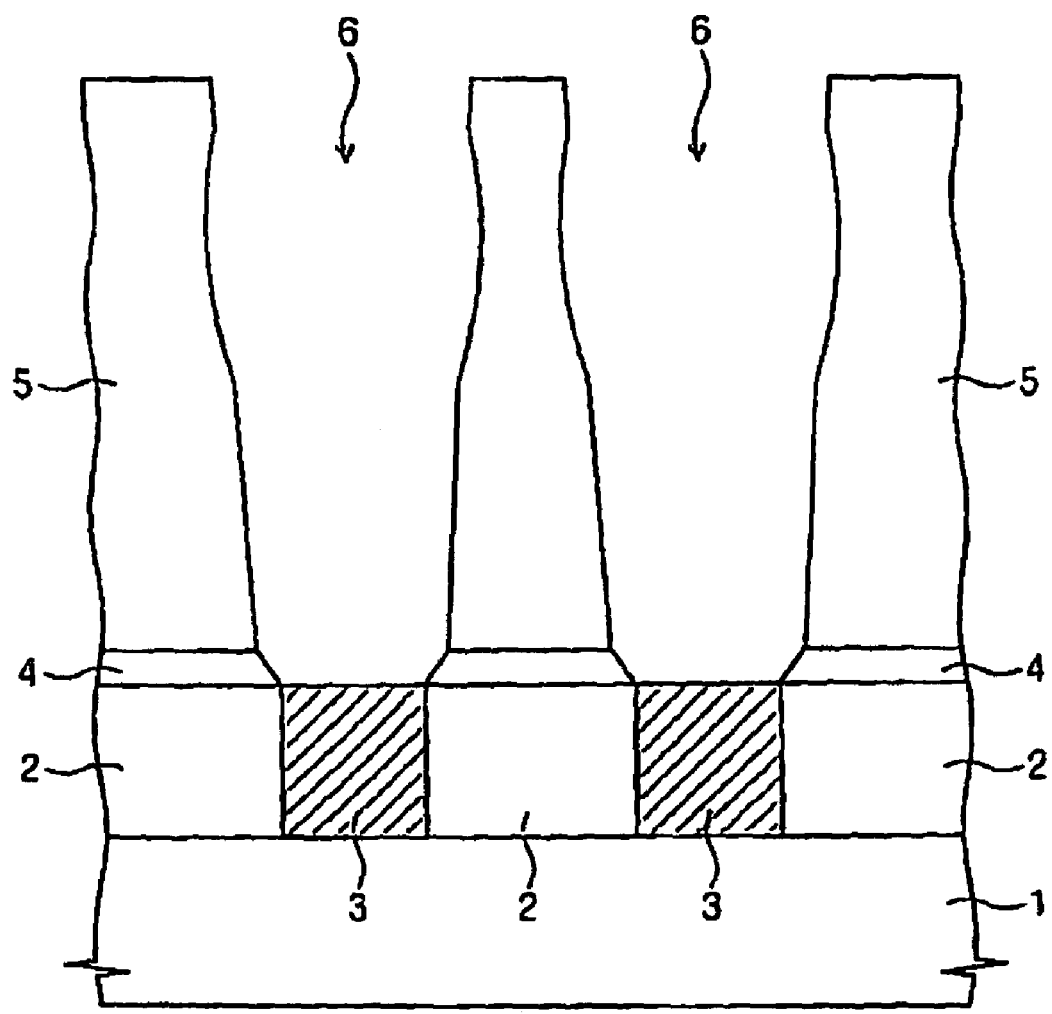
FIGS. 1A to 1C are diagrams illustrating a method of forming a conventional cylindrical bottom electrode.
Figure 1B:
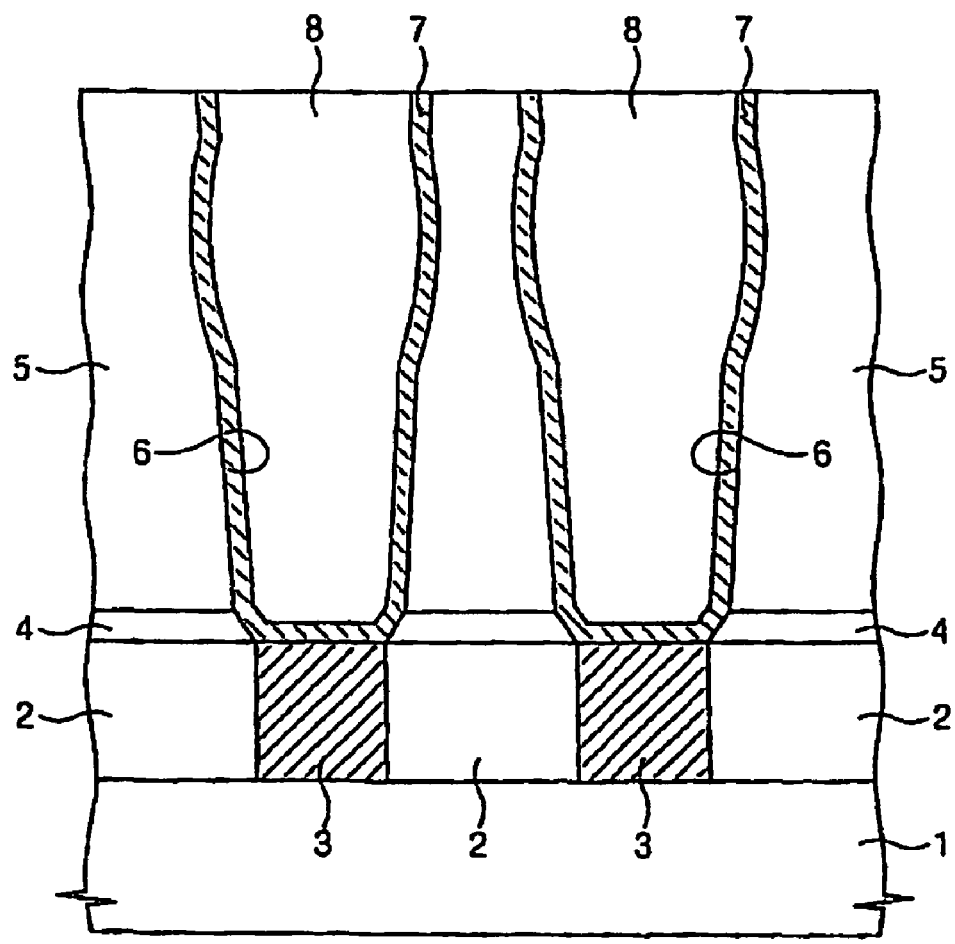
Figure 1C:
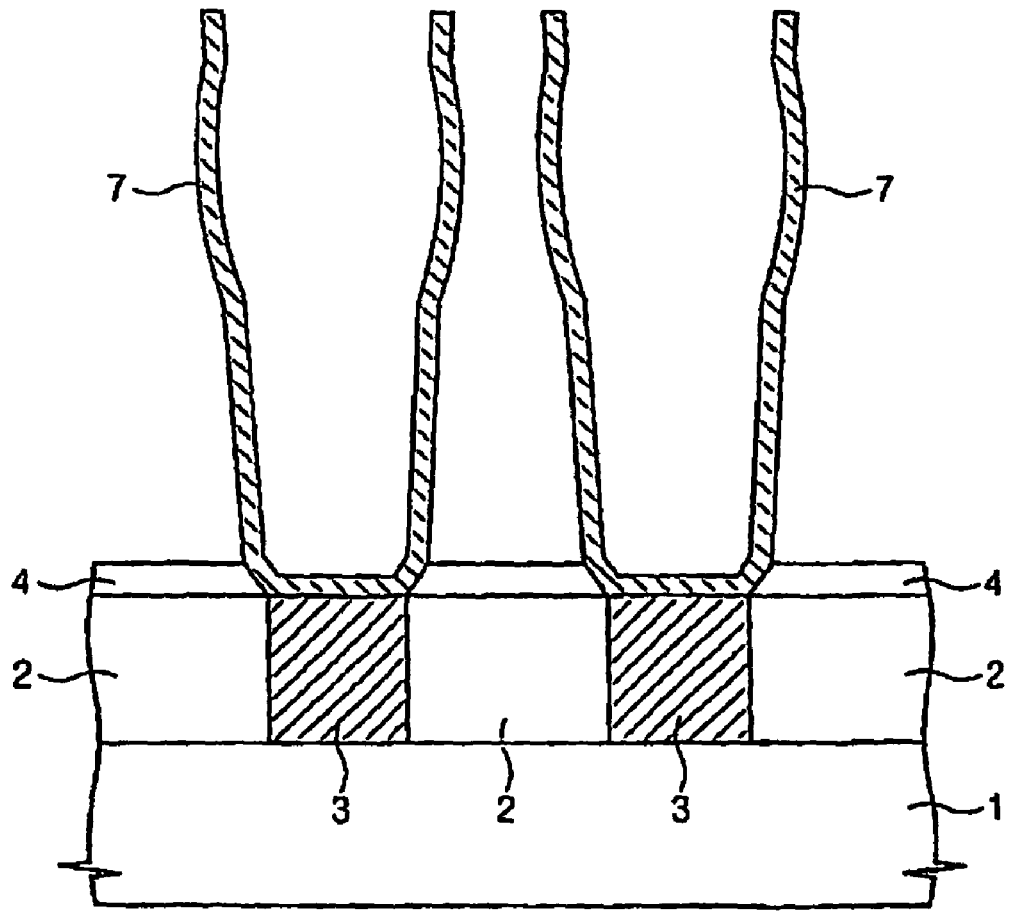

Reference will now be made in detail to the example embodiments of which are illustrated in the accompanying drawings. However, example embodiments are not limited to the embodiments illustrated herein after, and the embodiments herein are rather introduced to provide easy and complete understanding of the scope and spirit of example embodiments. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their detailed description will be omitted for conciseness.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
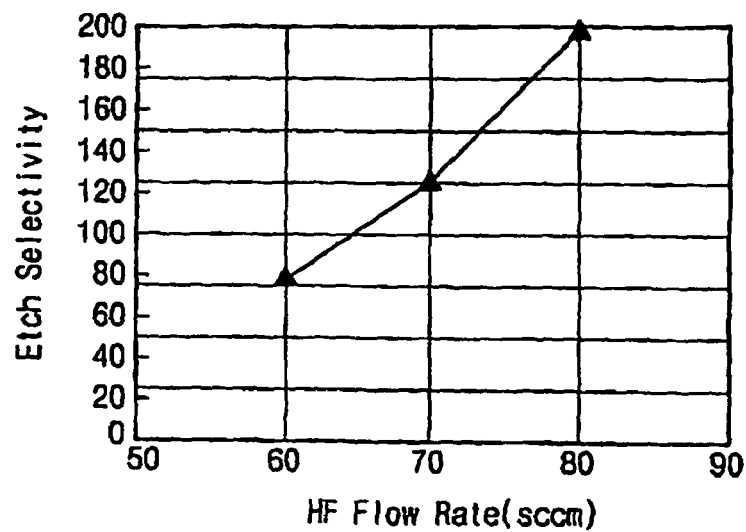

FIGS. 2A to 2E are diagrams illustrating a method of fabricating a semiconductor device having a capacitor according to example embodiments. FIG. 6 is a graph illustrating characteristics of selectivity adjusting gas by an etching process that etches an etch stop layer according to example embodiments.

Figure 2A:
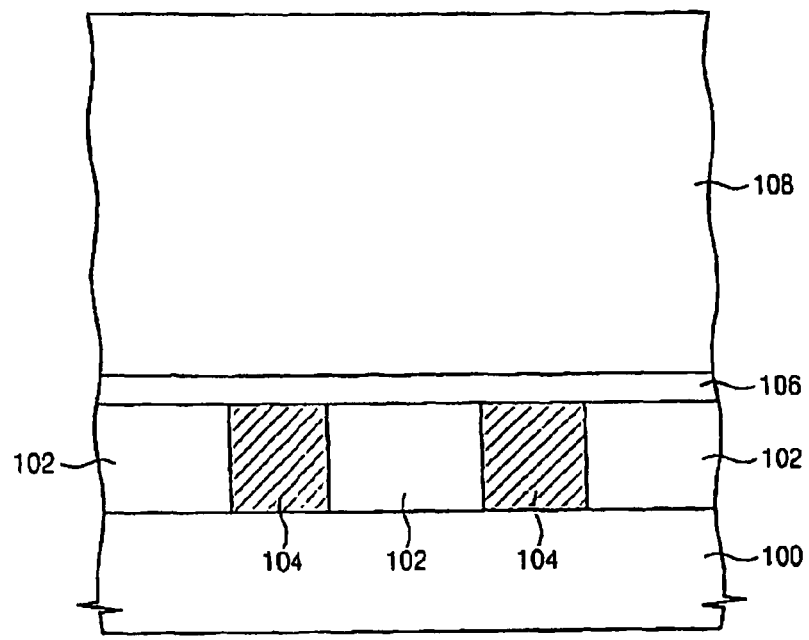
FIGS. 2A to 2E are diagrams illustrating a method of fabricating a semiconductor device having a capacitor according to example embodiments.

Referring to FIG. 2A, an interlayer insulation layer 102 may be formed on a semiconductor substrate 100 (hereinafter, referred to as a substrate). The interlayer insulation layer 102 may be formed of a silicon nitride layer. A MOS transistor (not shown), which is a switching device, may be formed on the substrate 100. The interlayer insulation layer 102 may cover the MOS transistor. A contact plug 104 may be formed through the interlayer insulation layer 102. The contact plug 104 may contact the substrate 100. Other conductive patterns may be inserted between the substrate 100 and the contact plug 104. A plurality of respectively separated contact plugs 104 may be formed in the interlayer insulation layer 102. The contact plugs 104 may be disposed along a row and a column. The contact plug 104 may be formed of a conductive material. For example, the contact plug 104 may be formed of one selected from doped polysilicon, metal (e.g., tungsten and/or molybdenum), conductive metal nitride (e.g., titanium nitride and/or tantalum nitride) and metal silicide (e.g., tungsten silicide and/or cobalt silicide).

An etch stop layer 106 covering the interlayer insulation layer 102 and the contact plug 104 may be formed on the substrate. A mold layer 108 may be formed on the etch stop layer 106. The etch stop layer 106 may be formed of an insulation layer having an etch selectivity with respect to the mold layer 108. The etch stop layer 106 may have an etch selectivity with respect to the interlayer insulation layer 102. For example, the mold layer 108 may be formed of a silicon oxide layer. The etch stop layer 106 may be formed of the silicon nitride layer.

Figure 2B:
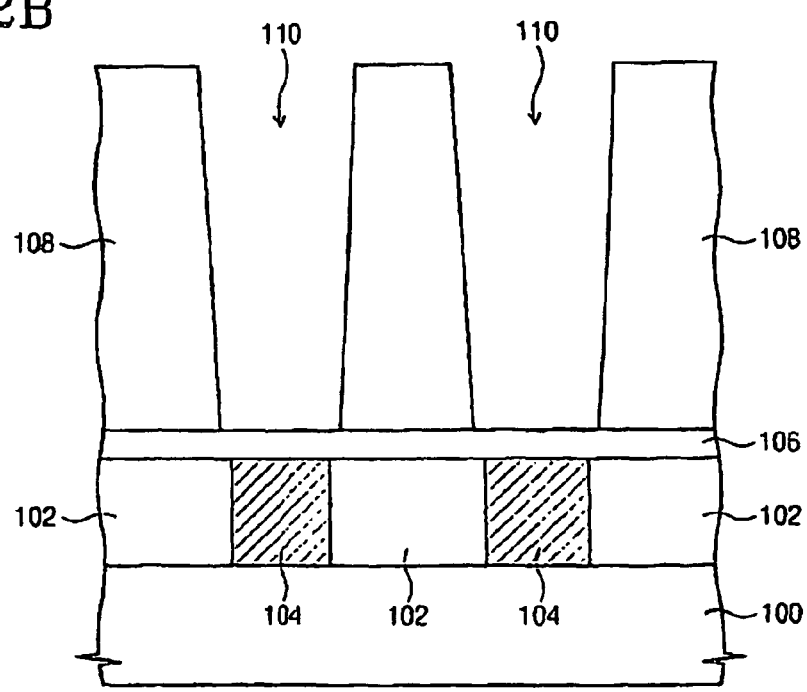

Referring to FIG. 2B, a mold electrode hole 110 may be formed to expose a portion of the etch stop layer 106 by patterning the mold layer 108. The etch stop layer 106 exposed to the mold electrode hole 110 may be disposed on the contact plug 104. The mold electrode hole 110 corresponding to each contact plug 104 may be formed. A plurality of mold electrode holes 110 respectively corresponding to a plurality of contact plugs 104 may be formed in the mold layer 108. A sidewall of the mold electrode hole 110 may be formed at a slant. The mold electrode hole 110 may have a top diameter larger than its bottom diameter.

Figure 2C:
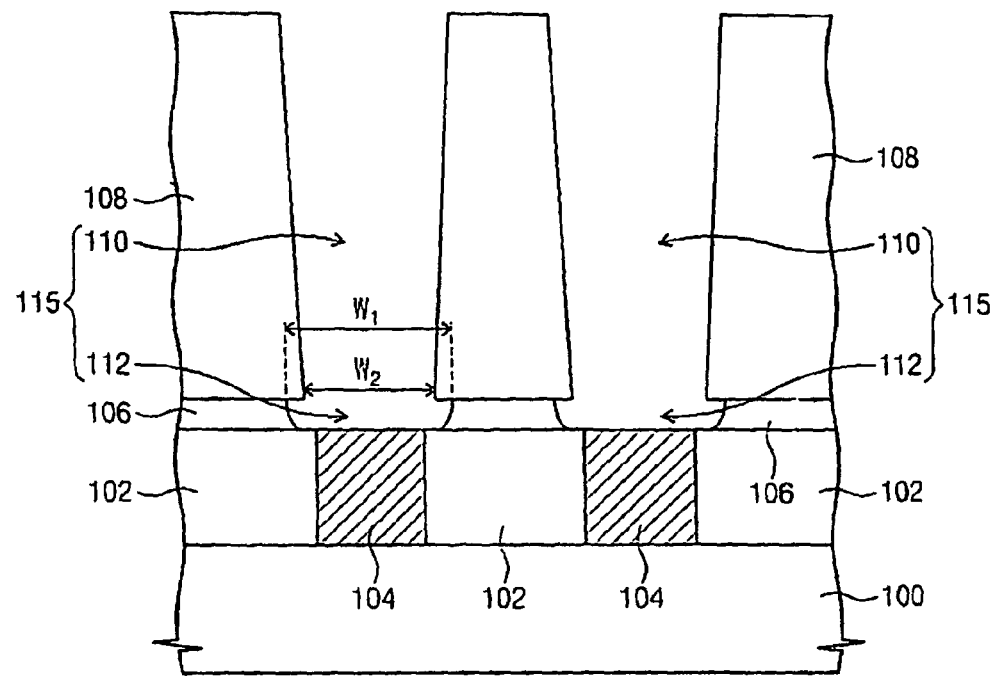

Referring to FIG. 2C, the etch stop layer 106 exposed to the mold electrode hole 110 may be isotropic-wet-etched to form a contact electrode hole 112 through the etch stop layer 106. A capacitor electrode hole 115 may include the mold and contact electrode holes 110 and 112. The isotropic dry etching process may utilize a process gas including main etching gas and selectivity adjusting gas. The isotropic dry etching process may utilize radical components of the process gas in a plasma state formed by a remote plasma method. The process gas may become a plasma state outside an etching process chamber and the radical components of the process gas in a plasma state may be injected in the process chamber. The etch stop layer 106 may be etched through diffusion by the radical components of the process gas, and thus the isotropic dry etching process may be performed.

The main etching gas may be used for etching the etch stop layer 106. The selectivity adjusting gas may improve an etch selectivity between the etch stop layer 106 and the mold layer 108. The selectivity adjusting gas may increase an etch rate of the etch stop layer 106 by the isotropic dry etching process more than an etch rate of the mold layer 108 by the isotropic wet etching process. Due to the selectivity adjusting gas, an etch rate of the etch stop layer 106 may be ten times higher than an etch rate of the mold layer 108 by the isotropic dry etching process. For example, an etch selectivity of the etch stop layer 106 to the mold layer 108 may be about 10:1 to about 300:1 by the isotropic dry etching process.

When the etch stop layer 106 is formed of a silicon nitride layer, the main etching gas may be fluorocarbon-based gas including carbon and fluorine. For example, the main etching gas may be $CF_4$ gas. The selectivity adjusting gas may be at least one selected from the group consisting of HF gas, $H_2O$ gas and/or $C_2H_5OH$ gas. A flow rate of the selectivity adjusting gas may be about 10 sccm to about 500 sccm. A process temperature of the isotropic dry etching process may be about 20° C. to about 70° C.

The process gas may further include activation auxiliary gas. The activation auxiliary gas may accelerate activation of the main etching gas. For example, when the main etching gas is fluorocarbon-based gas, oxygen gas may be used for the activation auxiliary gas. The process gas may further include byproduct auxiliary gas. The byproduct auxiliary gas may accelerate forming a volatile byproduct during the isotropic dry etching process. For example, nitrogen gas may be used for the byproduct accelerating gas.

FIG. 6 is a graph illustrating characteristics of selectivity adjusting gas by an etching process that etches an etch stop layer according to example embodiments. Characteristics of the selectivity adjusting gas will be described with reference to FIG. 6.

Referring to FIGS. 2C and 6, an x-axis represents a flow rate of etch rate adjusting gas, and a y-axis represents an etch selectivity of a silicon nitride layer for the etch stop layer 106 and a silicon oxide layer for the mold layer 108 by the isotropic dry etching process. The etch selectivity may be obtained by dividing an etch rate of the silicon nitride layer by an etch rate of the silicon oxide layer.

The process gas may include $CF_4$ gas, HF gas, $O_2$ gas and/or $N_2$ gas. A flow rate of $CF_4$ gas, $O_2$ gas and/or $N_2$ gas may be fixed, but a flow rate of HF gas may be changed. As illustrated in FIG. 6, the etch selectivity may increase according to a rise (about 60 sccm, about 70 sccm and/or about 80 sccm) in the volume of HF gas. The etch selectivity may be about 80 when the flow rate of the HF gas is about 60 sccm, and the etch selectivity may be about 200 when the flow rate of the HF gas is about 80 sccm. The etch selectivity may be improved by using HF gas.

Referring to FIG. 2C, because the exposed etch stop layer is etched using an isotropic dry etching process with a relatively high etch selectivity, a conventional bowing effect may be minimized or reduced. The exposed etch stop layer 106 may be isotropically etched by the isotropic dry etching process. At least a portion of the contact electrode hole 112 may have a diameter W1 larger than a bottom diameter W2 of the mold electrode hole 110.

When performing the isotropic dry etching process on the etch stop layer 106 exposed to the mold electrode hole 110, a mask pattern (not shown) for forming the mold electrode hole 110 may remain on the mold layer 108. Unlike the above, after the mold electrode hole 110 is formed, a mask pattern (not shown) for forming the mold electrode hole 110 may be removed. The isotropic dry etching process may be performed.

Figure 2D:
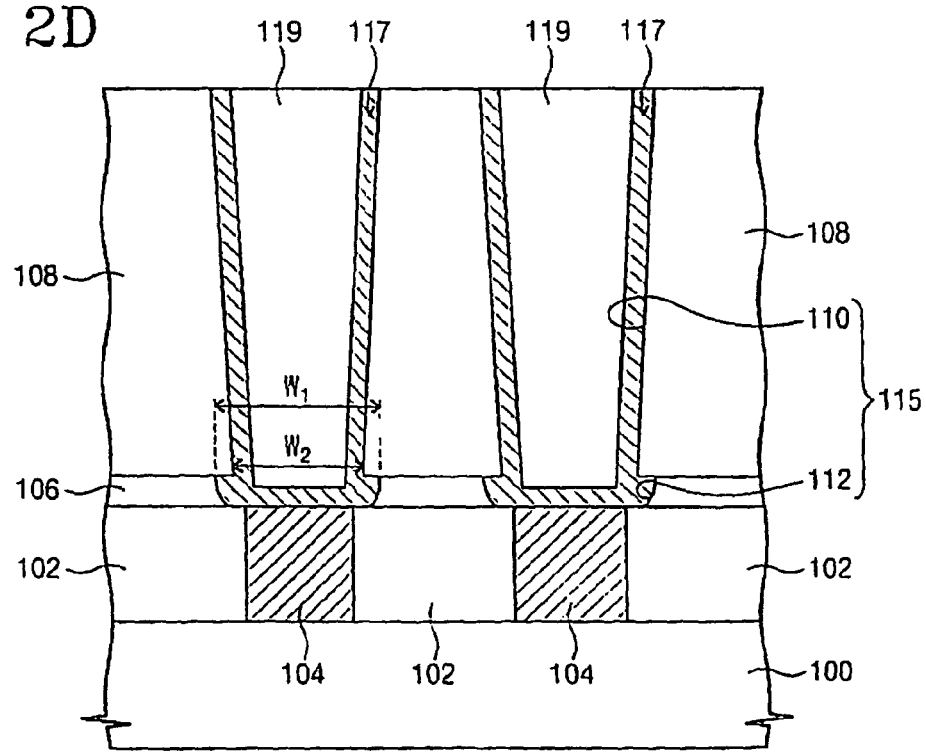

Referring to FIG. 2D, a conductive layer may be substantially formed on the substrate 100 with the capacitor electrode hole 115, and then a sacrificial layer may be formed on the conductive layer. The sacrificial layer and the conductive layer may be planarized until the top of the mold layer 108 is exposed to form a cylindrical bottom electrode 117 and a sacrificial pattern 119 in the capacitor electrode hole 115. The bottom electrode 117 may be formed of one selected from the group consisting of doped polysilicon, conductive metal nitride (e.g., titanium nitride and/or tantalum nitride), noble metal (e.g., Pt, Ir and/or Ru) and/or conductive metal oxide (e.g., iridium oxide layer). The sacrificial pattern 119 may be formed of material having an etch selectivity with respect to the etch stop layer 106. The sacrificial pattern 119 may be formed of material having an etch rate similar to an etch rate of the mold layer 108. For example, the sacrificial pattern 119 may be formed of a silicon oxide layer.

Figure 2E:
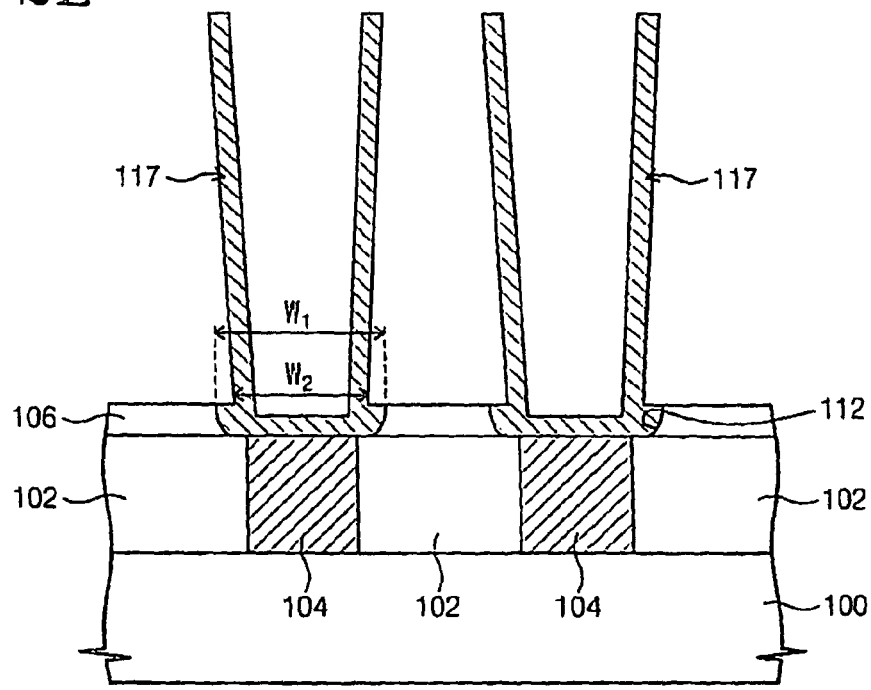

Referring to FIG. 2E, the sacrificial pattern 119 and the mold layer 108 may be removed to expose the surface of the bottom electrode 117. A dielectric layer of FIG. 3 may be formed on the surface of the bottom electrode 117, and also a top electrode 123 of FIG. 3 covering the bottom electrode 117 may be formed on the dielectric layer 121.

According to the method of fabricating the semiconductor device, the etch stop layer 106 exposed to the mold electrode hole 110 may be etched using the isotropic dry etching process. Process gas by the isotropic dry etching process may increase an etch selectivity between the etch stop layer 106 and the mold layer 108 using selectivity adjusting gas. A vowing effect may be minimized or decreased to prevent or reduce contact phenomena between the related bottom electrodes. Through the isotropic dry etching process, a diameter W1 of the contact electrode hole 112 below the mold electrode hole 110 may increase. The contact electrode hole 112 may have the diameter W1 larger than a bottom diameter W2 of the mold electrode hole 110. Because a support portion (e.g., the sum of the bottom area and the side area in the contact electrode hole 112)) of the bottom electrode 117 increases, slanting of the bottom electrode 117 may be minimized or reduced, and also stiction may be minimized or reduced. Contact phenomena between the bottom electrodes may be prevented or reduced. A capacitor semiconductor device will be described with reference to FIG. 3.

Figure 3:
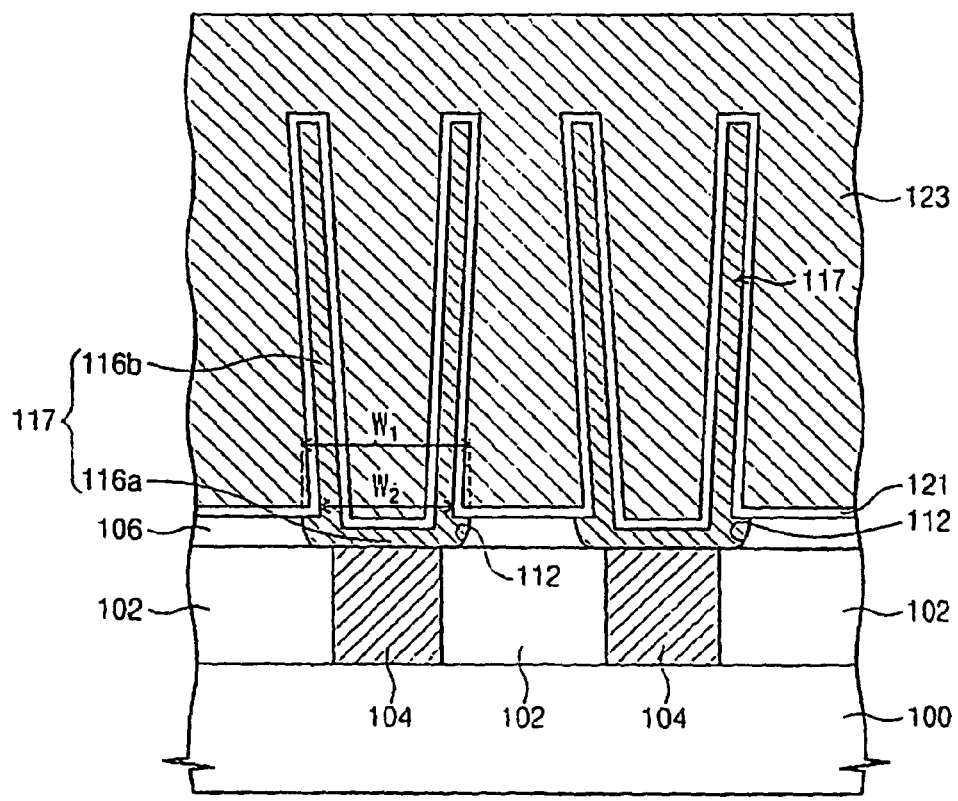

FIG. 3 is a diagram illustrating a semiconductor device having a capacitor according to example embodiments. Referring to FIG. 3, an interlayer insulation layer 102 may be disposed on a substrate 100, and a contact plug 104 may be formed through the interlayer insulation layer 102. The contact plug 104 may contact the substrate 100. The etch stop layer 106 having the contact electrode hole 112 may cover the interlayer insulation layer 102. The contact electrode hole 112 may be formed through the etch stop layer 106 to expose the contact plug 104. All diameters of the contact holes 112 may be larger than a diameter of the contact plugs 104.

The support portion 116a may contact a sidewall of the contact electrode hole 112. The cylindrical sidewall 116b may protrude toward the top of the etch stop layer 106. At least a portion of the support portion 116a may have a diameter W1 larger than a bottom diameter W2 of the cylindrical sidewall 116b adjacent to the contact electrode hole 112. The diameter W1 of the support portion 116a may correspond to the diameter W1 of the contact electrode hole 112 of FIG. 2C. The bottom diameter W2 of the cylindrical sidewall 116b adjacent to the contact electrode hole 112 may correspond to the bottom diameter W2 of the mold electrode hole 110 of FIG. 2C. The cylindrical sidewall 116b may extend upward in a linear form. A top diameter of the cylindrical sidewall 116b may be more slanted than its bottom diameter.

Because at least a portion of the support portion 116a has a diameter W1 larger than a bottom diameter W2 of the cylindrical sidewall 116b, slanting of the bottom electrode 117 may be minimized or reduced. Contact phenomena between the conventional bottom electrodes may be prevented or reduced. A dielectric layer 121 may be substantially formed on the surface of the bottom electrode 117. The dielectric layer 121 may be formed of one selected from the group consisting of a silicon oxide layer, a silicon nitride layer and/or a high-k dielectric layer (e.g., a hafnium oxide layer and/or an aluminum oxide layer) having a relatively high dielectric constant compared to the silicon nitride layer. A top electrode 123 covering the bottom electrode 117 may be disposed on the dielectric layer 121. The top electrode 123 may be formed of a conductive material. For example, the top electrode 123 may be formed of one selected from the group consisting of doped polysilicon, conductive metal nitride (e.g., titanium nitride and/or tantalum nitride), noble metal (e.g., Pt, Ir and/or Ru) and/or conductive metal oxide (e.g., iridium oxide layer).

Figure 4A:
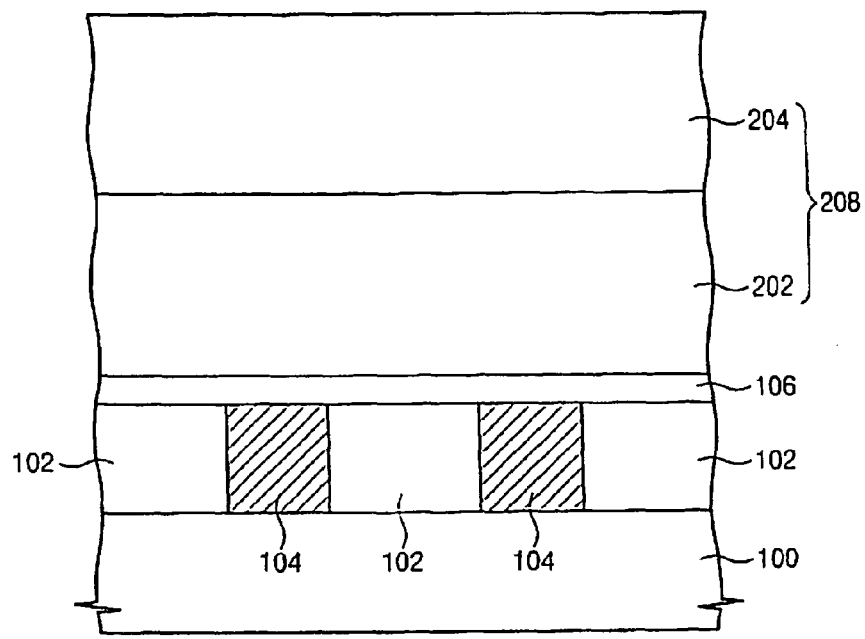
FIGS. 4A to 4F are diagrams illustrating a method of fabricating a semiconductor device having a capacitor according to example embodiments.

FIGS. 4A to 4F are diagrams illustrating a method of fabricating a semiconductor device having a capacitor according to other example embodiments. Referring to FIG. 4a, an interlayer insulation layer 102 may be formed on a substrate 100, and also a contact plug 104 may be formed through the interlayer insulation layer 102. An etch stop layer 106 may be formed on an entire surface of the substrate to cover the interlayer insulation layer 102 and the contact plug 104.

A mold layer 208 may be formed on the etch stop layer 106. The mold layer 208 may include a bottom material layer 202 and top material layer 204, which may be sequentially stacked. The mold layer 208 may be formed of material having an etch selectivity with respect to the etch stop layer 106. The top material layer 204 may be formed of material having a lower etch rate compared to an etch rate of the bottom material layer 202. For example, the bottom material layer 202 may be formed of one of a BPSG layer, a PSG layer and/or a BSG layer. The top material layer 204 may be formed of one of a plasma TEOS layer, an undoped oxide layer and/or a relatively high-density plasma oxide layer. According to the above, the bottom material layer 202 (doped with impurities) may have an etch rate higher than an etch rate of top material layer 204 (not doped with impurities). The bottom and top materials 204 and 202 may be formed of silicon oxide layer-based materials, and thus the mold layer 208 may have an etch selectivity with respect to the etch stop layer 106.

Figure 4B:
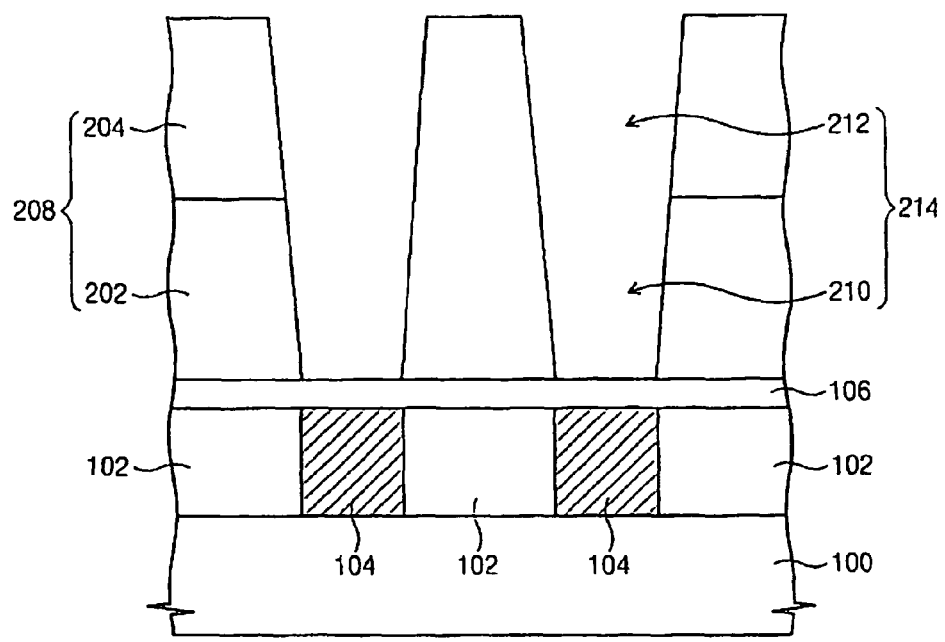

Referring to FIG. 4B, the top and bottom material layers 204 and 202 of the mold layer 208 may be continuously patterned to form a preliminary mold electrode hole 214 exposing a portion of the etch stop layer 106. The exposed etch stop layer 106 may be disposed on the contact plug 104. The preliminary mold electrode hole 214 may include a first part 210 through the bottom material layer 202, and a second part 212 disposed on the first part 210 through the top material layer 204. The first and second parts 210 and 212 may be connected to each other.

Figure 4C:
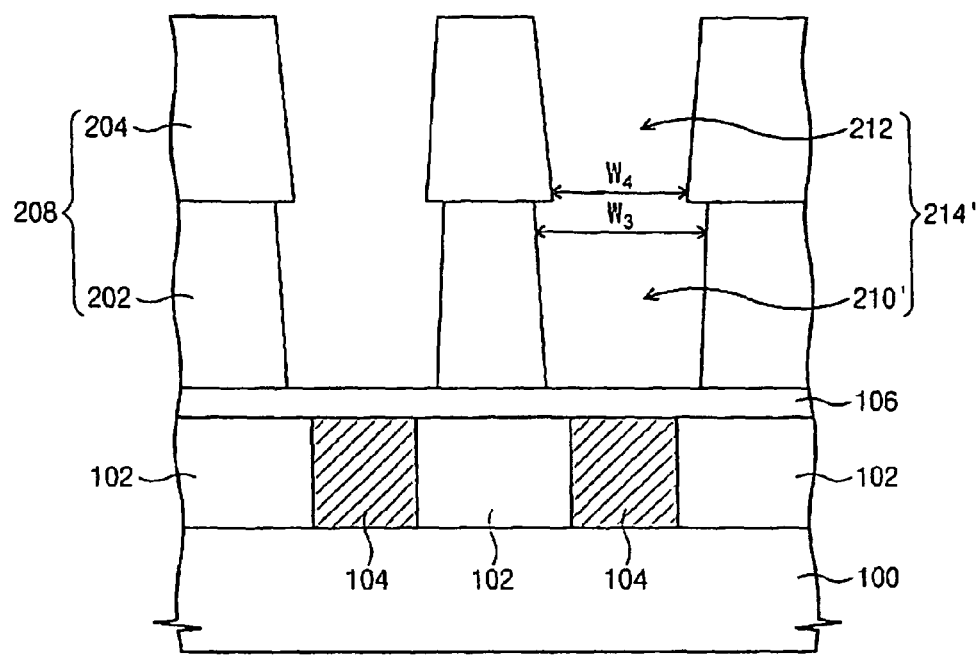

Referring to FIG. 4C, the bottom material layer 202 adjacent to the preliminary mold electrode hole 214 may be selectively isotropic-etched to form a mold electrode hole 214'. Because the bottom material layer 202 has a higher etch rate compared to that of the top material layer 204, the bottom material layer 202 may be selectively isotropic-etched (e.g., wet etching). The mold electrode hole 214' may include a first part 210' through the bottom material layer 202, and a second part 212 through the top material layer 204. The first and second parts 210' and 212 may be sequentially stacked and connected to each other. The first part 210' of the mold electrode hole 214' may have a top diameter W3 larger than a bottom diameter W4 in the second part 212 of the mold electrode hole 214'. A sidewall of the mold electrode hole 214' may be formed in a step form.

Figure 4D:
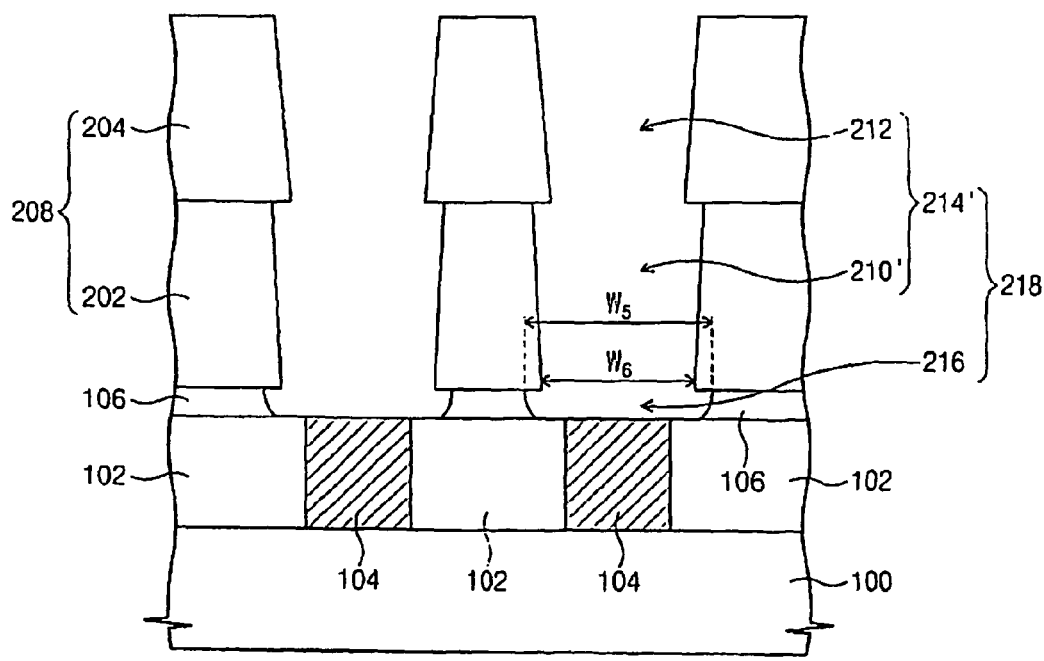

Referring to FIG. 4D, the etch stop layer 106 exposed to the mold electrode hole 214' may be isotropic-dry-etched to form a contact electrode hole 216 through the etch stop layer 106. A capacitor electrode hole 218 may include the mold electrode hole 214' and the contact electrode hole 216. The isotropic dry etching process, that is performed on the etch stop layer 106 exposed to the mold electrode hole 214', may be performed identical to the isotropic dry etching above. The isotropic dry etching may utilize process gas including main etching gas and selectivity adjusting gas. The isotropic dry etching may utilize radical components of the process gas in a plasma state formed by a remote plasma method. The main etching gas may be important etching gas for etching the etch stop layer 106. The selectivity adjusting gas may improve an etch selectivity between the etch stop layer 106 and the mold layer 208. The selectivity adjusting gas may increase an etch rate of the etch stop layer 106 by more than an etch rate of the mold layer 208 by the isotropic wet etching process. Due to the selectivity adjusting gas, the etch rate of the etch stop layer 106 may be ten times of the etch rate of the mold layer 208 by the isotropic dry etching process or more.

When the etch stop layer 106 is formed of a silicon nitride layer, the main etching gas may be fluorocarbon-based gas including carbon and fluorine. For example, the main etching gas may be $CF_4$ gas. The selectivity adjusting gas may be one selected from the group consisting of HF gas, $H_2O$ gas and/or $C_2H_5OH$ gas. A flow rate of the selectivity adjusting gas may be between about 10 and about 500 sccm. A process temperature of the isotropic dry etching process may be between about 20° C. and about 70° C. The process gas may further include activation auxiliary gas (e.g., oxygen gas) accelerating the activation of the main etching gas. The process gas may further include byproduct auxiliary gas (e.g., nitrogen gas) that accelerates forming a volatile byproduct by the isotropic dry etching process. Because the exposed etch stop layer 106 is isotropically etched by the isotropic dry etching process, the diameter of the contact electrode hole 216 may increase. At least a portion of the contact electrode hole 216 may have a diameter W5 larger than a bottom diameter W6 in the first part 210' of the mold electrode hole 214'.

Figure 4E:
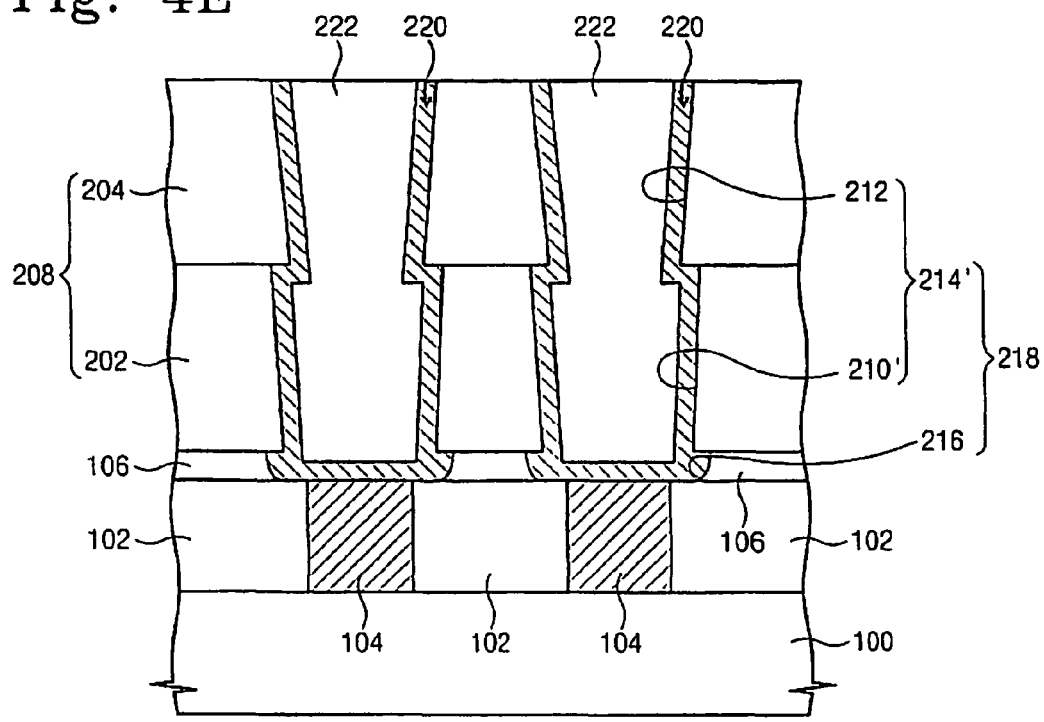

Referring to FIG. 4E, a conductive layer may be substantially formed on the substrate 100 having the capacitor electrode hole 218, and also a sacrificial layer may be formed on the conductive layer. The sacrificial layer and the conductive layer may be planarized until the top of the mold layer 208 is exposed to form a bottom electrode 220 and a sacrificial pattern 222 inside the capacitor electrode hole 218. Sidewalls of the cylindrical bottom electrode 220 and sacrificial pattern 222 may be in a step shape. The bottom electrode 220 and the sacrificial pattern 222 may be formed of material identical to material of the bottom electrode 117 and the sacrificial pattern 119 of FIG. 2D.

Figure 4F:
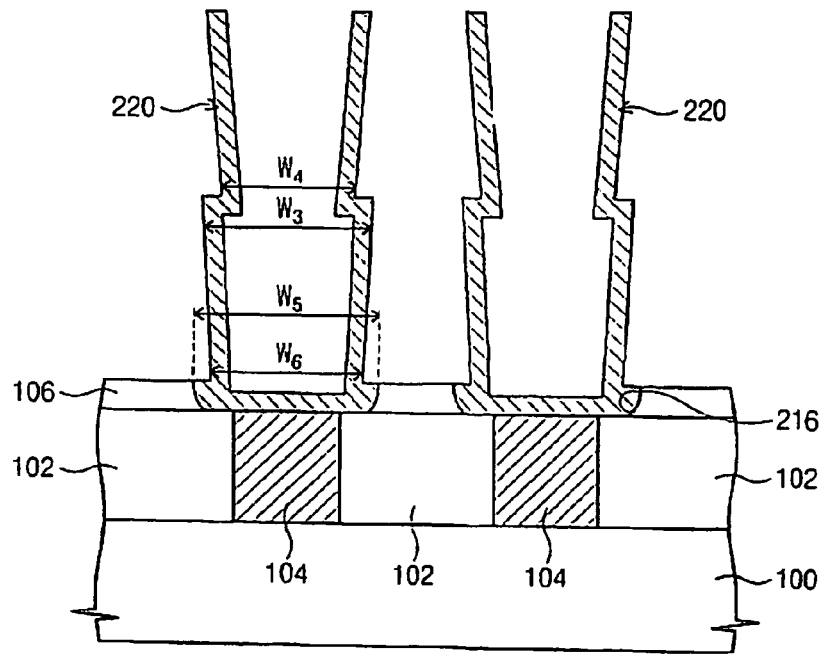

Referring to FIG. 4F, the sacrificial pattern 222 and the mold layer 208 may be removed to expose the surface of the bottom electrode 220. A dielectric layer 220 of FIG. 5 may be substantially formed on the surface of the bottom electrode 220, and also a top electrode 226 of FIG. 5 covering the bottom electrode 220 may be formed on the dielectric layer 224. This method may achieve an effect identical to an effect of using the isotropic dry etching process. The sidewall of the bottom electrode 220 may be formed in a step shape. A surface area of the bottom electrode 220 may be increased in a limited area.

Figure 5:
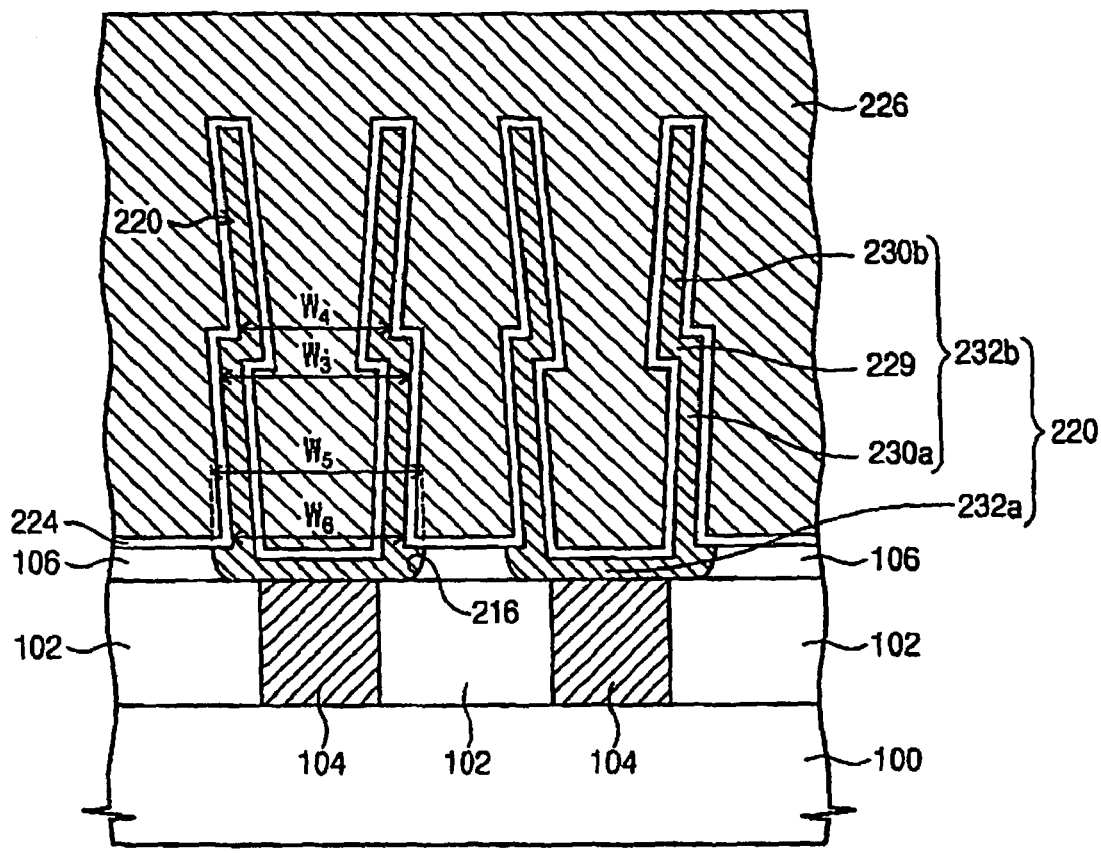

A semiconductor device according to example embodiments will be described with reference to FIG. 5. FIG. 5 is a diagram illustrating a semiconductor device having a capacitor according to other example embodiments. Referring to FIG. 5, an interlayer insulation layer 102 may be disposed on the substrate 100, and a contact plug 104 may be formed through the interlayer insulation layer 102. The etch stop layer 106 having the contact electrode hole 216 may cover the interlayer insulation layer 102. The contact electrode hole 216 may be formed through the etch stop layer 106 to expose the contact plug 104. All diameters of the contact holes 216 may be larger than diameters of the contact plugs 104.

The bottom electrode 220 may be disposed on the bottom of the contact electrode hole 216 to contact the contact plug 104. The bottom electrode 220 may include a support portion 232a disposed in the contact electrode hole 216, and a cylindrical sidewall 232b extended in the upper direction from the support portion 232. The support portion 232a may contact the sidewall of the contact electrode hole 216. The cylindrical sidewall 232b may protrude in the upper direction from the top of the etch stop layer 106.

The cylindrical sidewall 232b may be in a step form. The cylindrical sidewall 232b may include a first sidewall 230a and a second sidewall 230b, which may be sequentially stacked, and a connection part 229 connecting the first sidewall 230a with the second sidewall 230b. Both ends of the connection part 229 may be connected to the top of the first sidewall 230a and the bottom of the second sidewall 230b. The top outer diameter W3 of the first sidewall 230a may be larger than the bottom outer diameter W4 of the second sidewall 230b. The top outer diameter W3 of the first sidewall 230a may be larger than the bottom outer diameter W4 of the first sidewall 230a. The top outer diameter W3 of the second sidewall 230b may be larger than the bottom outer diameter W4 of the second sidewall 230b.

At least a portion of the support portion 232a may have an outer diameter W5 larger than the bottom outer diameter W6 (e.g., the bottom outer diameter of the first sidewall 230a) of the cylindrical sidewall 232a adjacent to the contact electrode hole 216. A support portion (e.g., bottom and sidewall of the contact electrode hole 216) of the support portion 232a may be increased in order to minimize or reduce slanting of the bottom electrode 220. Contact phenomena between the conventional adjacent bottom electrodes may be prevented or reduced. A dielectric layer 224 may be substantially formed on the surface of the bottom electrode 220, and also a top electrode 226 covering the bottom electrode 220 may be disposed on the dielectric layer 224. The dielectric layer 224 and the top electrode 226 may be, respectively, formed of the material identical to material of the dielectric layer 121 and the top electrode 123 of FIG. 3.

As described above, the etch stop layer exposed to the mold electrode hole may be etched using the isotropic dry etching process. The process gas used in the isotropic dry etching process may include the main etching gas and the selectivity adjusting gas. The selectivity adjusting gas may improve an etch selectivity between the etch stop layer and the mold layer. Because the exposed etch stop layer is etched using an isotropic dry etching process with a relatively high etch selectivity, the conventional bowing effect may be minimized or reduced. Due to the isotropic dry etching, the diameter of the contact electrode hole in the etch stop layer may be increased compared to the conventional art. The support portion of the bottom electrode may be increased to minimize or reduce the slanting of the bottom electrode. Contact phenomena between conventional adjacent bottom electrodes may be prevented or reduced.

It will be apparent to those skilled in the art that various modifications and variations may be made in example embodiments. Thus, it is intended that example embodiments cover the modifications and variations of example embodiments provided they come within the scope of the appended claims and their equivalents.

What is claimed is:

1. A semiconductor device, comprising:
    a contact plug extending through an interlayer insulation layer on a substrate;
    an etch stop layer covering the interlayer insulation layer, wherein the etch stop layer includes a contact electrode hole extending through the etch stop layer, and the contact electrode hole has a diameter larger than a diameter of the contact plug; and
    a bottom electrode having a support portion in the contact electrode hole, and a cylindrical sidewall extending upward from the support portion,
    wherein at least a portion of the support portion has an outer diameter larger than a bottom outer diameter of the cylindrical sidewall.

2. The semiconductor device of claim 1, wherein the cylindrical sidewall is extended upward in a linear form.

3. The semiconductor device of claim 2, wherein the cylindrical sidewall is slanted, and has a top outer diameter larger than the bottom outer diameter of the cylindrical sidewall.

4. The semiconductor device of claim 1,
    wherein the contact electrode hole exposes the contact plug, and the support portion is connected to the contact plug.

5. The semiconductor device of claim 1, further comprising:
    a dielectric layer on a surface of the bottom electrode; and
    a top electrode on the dielectric layer to cover the bottom electrode.

6. The semiconductor device of claim 1, wherein the support portion is within the contact electrode hole and delimited by the etch stop layer.

7. A semiconductor device, comprising:
    an etch stop layer on a substrate, wherein the etch stop layer includes a contact electrode hole extending through the etch stop layer; and
    a bottom electrode having a support portion in the contact electrode hole, and a cylindrical sidewall extending upward from the support portion,
    wherein the cylindrical sidewall is in step form, and includes sequentially— stacked first and second sidewalls and a connection part connecting the first sidewall to the second sidewall,
    wherein the first sidewall has a top outer diameter larger than a bottom outer diameter of the second sidewall, and a diameter of the contact electrode hole is larger than a bottom outer diameter of the first sidewall, and
    wherein a bottom surface of the first sidewall is at a same height as an upper surface of the etch stop layer.

8. The semiconductor device of claim 7, wherein the support portion is within the contact electrode hole and delimited by the etch stop layer.

* * * * *